United States Patent
Winter et al.

(10) Patent No.: US 11,579,672 B1
(45) Date of Patent: *Feb. 14, 2023

(54) THERMAL MASS AWARE THERMAL MANAGEMENT

(71) Applicant: Meta Platforms, Inc., Menlo Park, CA (US)

(72) Inventors: Howard William Winter, Southampton (GB); Chuankeat Kho, San Jose, CA (US); Peter John Richard Gilbert Bracewell, Union City, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/523,684

(22) Filed: Nov. 10, 2021

Related U.S. Application Data

(63) Continuation of application No. 17/086,497, filed on Nov. 2, 2020, now Pat. No. 11,199,885, which is a continuation of application No. 16/115,109, filed on Aug. 28, 2018, now Pat. No. 10,845,854.

(51) Int. Cl.
| | |
|---|---|
| *G06F 1/26* | (2006.01) |
| *G06F 1/32* | (2019.01) |
| *G06F 1/20* | (2006.01) |
| *H05K 7/20* | (2006.01) |
| *G06F 1/3287* | (2019.01) |

(52) U.S. Cl.
CPC ............ *G06F 1/206* (2013.01); *G06F 1/3287* (2013.01); *H05K 7/2039* (2013.01)

(58) Field of Classification Search
CPC ...... G06F 1/206; G06F 1/3287; H05K 7/2039
See application file for complete search history.

(56) References Cited

U.S. PATENT DOCUMENTS

| | | |
|---|---|---|
| 8,589,931 B2 | 11/2013 | Barsness et al. |
| 2005/0071705 A1 | 3/2005 | Bruno et al. |
| 2009/0281761 A1 | 11/2009 | Bandholz et al. |
| 2015/0146327 A1 | 5/2015 | Pfitzer et al. |
| 2015/0309547 A1 | 10/2015 | Huang et al. |
| 2019/0179383 A1 | 6/2019 | Leva et al. |
| 2019/0310694 A1 | 10/2019 | Davis et al. |

OTHER PUBLICATIONS

Notice of Allowance dated Jul. 29, 2020 for U.S. Appl. No. 16/115,109, filed Aug. 28, 2018, 60 Pages.
Preinterview First Office Action dated Mar. 30, 2020 for U.S. Appl. No. 16/115,109, filed Aug. 28, 2018, 36 Pages.

*Primary Examiner* — Nitin C Patel
(74) *Attorney, Agent, or Firm* — Greenberg Traurig, LLP

(57) ABSTRACT

The disclosed computing device may include electronic components, at least one of which is a processor. The computing device may also include a heat sink thermally coupled to the electronic components, as well as a temperature sensor that determines the current temperature inside the computing device. The computing device may further include a controller. The processor may generate a load schedule for the electronic components based on the current temperature inside the computing device. This load schedule ensures that a maximum temperature for the heat sink is not exceeded even when the total system power load exceeds, for a short period of time, the maximum sustainable power level the heat sink can dissipate. The controller may then load the electronic components according to the generated load schedule. Various other methods, systems, and computer-readable media are also disclosed.

20 Claims, 8 Drawing Sheets

THERMAL MASS AWARE THERMAL MANAGEMENT

CROSS REFERENCE TO RELATED APPLICATION

This application is a continuation of U.S. application Ser. No. 17/086,497, filed 2 Nov. 2020, now U.S. Pat. No. 11,199,865 which is a continuation of U.S. application Ser. No. 16/115,109, filed 28 Aug. 2018, now U.S. Pat. No. 10,845,454 issued on Nov. 24, 2020, the disclosures of each of which are incorporated, in their entirety, by this reference.

BACKGROUND

Most electronic components generate heat during operation. Processors, for example, typically require many tens or hundreds of watts of power to perform their calculations. The flow of electricity that supplies this power generates heat. This heat must be dissipated in some manner to ensure that the component does not exceed its operating temperature. Further, if a given component is operated below its maximum operating temperature its lifespan can often be increased and transient error rates reduces.

Cooling mechanisms for electronic components typically fall into two different categories: active cooling and passive cooling. In active cooling scenarios, fans, liquid pumps or other devices are used to blow air or circulate liquid over the surface of the components to remove heat and lower temperature. In passive cooling scenarios, heat sinks are typically coupled with electronic components and dissipate heat via conduction to the heat sink and then via radiation and convection to the surroundings. Heat sink designers typically try to maximize the surface area of the heat sink to allow as much of the heat as possible to be transferred to the surrounding air or liquid.

SUMMARY

As will be described in greater detail below, the instant disclosure describes systems and methods to reduce heat sink size and cost and extend the life of electronic equipment by controlling load placed on electronic components according to a loading schedule. The loading schedule ensures that a maximum temperature for the heat sink is not exceeded even when the total system load (power) exceeds, for a short period of time, the maximum sustainable power level the heat sink could dissipate.

In one example, a computing device may include various electronic components, at least one of which is a processor. The computing device may also include a heat sink thermally connected to the electronic components, as well as a temperature sensor that determines the current ambient air temperature inside the computing device. The computing device may further include a controller. The processor may generate a load schedule for the electronic components based on the current internal air temperature of the computing device and the heat sink. This load schedule may ensure that a maximum temperature for the heat sink and internal air of the computing device is not exceeded. The controller may then load the electronic components according to the generated load schedule.

In some examples, the heat sink may be a passive heat sink, while in other examples, the heat sink may be an active heat sink. Determining the current temperature inside the computing device (i.e., the internal air) may include determining the current temperature of at least one of the electronic components in the computing device.

In some examples, the computing device may include a housing disposed around the electronic components, the temperature sensor and/or the controller. In such examples, determining the current temperature inside the computing device may include determining an internal air temperature within the housing.

In some examples, the computing device may include a sound transducer configured to detect audio inputs, and or an input jack to connect to an external microphone. The detected audio inputs may then be processed by the processor.

In some examples, a value for the thermal mass of the heat sink may be accessed or detected by the processor, and the load schedule may be calculated based on the thermal mass of the heat sink. The load schedule may be further calculated based on an inertia value indicating how long the heat sink will take to heat up or cool down by a specified amount.

In some examples, the load schedule may be calculated to maintain an average power load of the computing device over a specified period of time. In some examples, the load schedule may be calculated based on an anticipated future power load on the electronic components.

In some examples, the load schedule may control physical operation of at least some of the electronic components. As such, energy consumed by the electronic components is reduced or increased dynamically by the controller.

In addition, a corresponding computer-implemented method may be provided which may include determining the current temperature of a heat sink connected to a computing device, determining an anticipated future power load for various electronic components thermally connected to the heat sink, identifying an amount of time needed for the heat sink to reach a maximum temperature based on the determined current temperature of the heat sink, current and historical power load and based on the anticipated future load, and controlling load on the electronic components in such a manner that the maximum temperature of the heat sink (and internal air) is not exceeded and future power usage can be optimized.

In some examples, controlling load on the electronic components may include controlling central processing unit (CPU) clock speed, amplifier power level, or battery charge rate or power provided to external devices. In some examples, the load on the electronic components may be controlled such the average power load of computing device is at or below a specified threshold.

In some examples, identifying the amount of time needed for the heat sink to reach a maximum temperature based on the determined current temperature of the heat sink, current and historical power load and based on the anticipated future load may further include accessing or determining a mass value indicating the mass of the heat sink, and using the mass of the heat sink when identifying the specified amount of time.

In some examples, when controlling the load, the system may be permitted to exceed an average power level for a specified amount of time. This may allow a surge in processing when needed. In some examples, controlling the load on the electronic components may include accessing and implementing historical power load and temperature data for the computing device.

In some examples, the computing device may have subsystems that are each capable of being individually throttled or shut down. Controlling load on the electronic components may include shutting down or throttling some or all of the computing device's subsystems for a specified amount of time.

In some examples, the above-described method may be encoded as computer-readable instructions on a computer-readable medium. For example, a computer-readable medium may include one or more computer-executable instructions that, when executed by at least one processor of a computing device, may cause the computing device to determine the current temperature of a heat sink connected to a computing device, determine an anticipated future load for various electronic components thermally connected to the heat sink, identify an amount of time needed for the heat sink to reach a maximum temperature based on the determined current temperature of the heat sink and based on the anticipated future load, and control load on the one or more electronic components so that the maximum temperature of the heat sink (and internal air) is not exceeded for longer than a specified time.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1A:
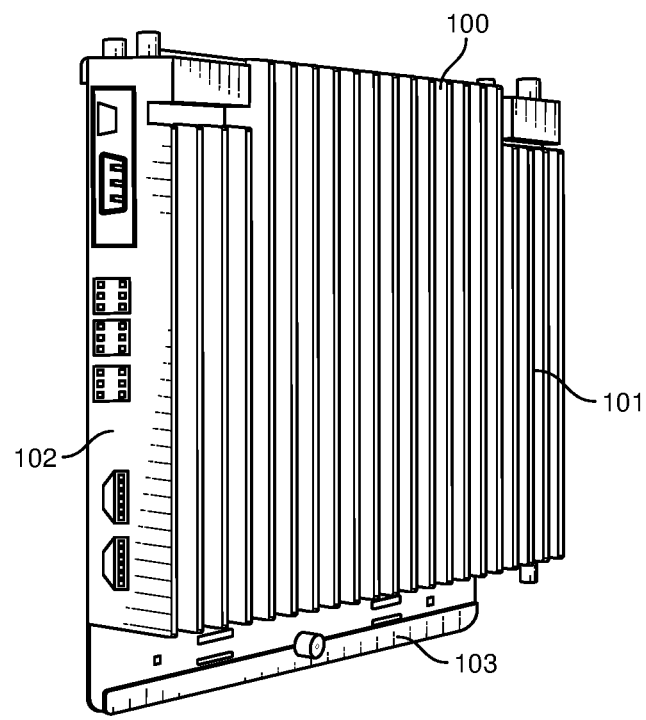
FIG. 1A illustrates an example embodiment of a computing device that controls electronic component load to govern internal temperature.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to governing the internal temperature of a computing device by controlling the load on various electronic components. The computing devices described herein are primarily cooled using passive heat sinks. These devices may be able to access or determine the thermal mass of the heat sink, and may further determine how long it will take for the heat sink to change temperature based on historical load. Using this information, the computing device may provide surge experiences to a user (e.g. provide additional processing when needed) that may briefly exceed a sustainable power level for the device. A CPU, for example, may require extra power for a brief time. The CPU will heat up quickly, but the attached heat sink will heat up much more slowly. After the surge in load, the heat may then be mitigated by slowing or terminating operation of certain components or subsystems within the device. Having this level of control over individual component load may also allow the computing device to have a heat sink that is smaller than would otherwise be necessary for worst case scenarios, providing a reduction in cost for the device.

As will be explained in greater detail below, embodiments of the instant disclosure include a computing device with different electronic components. At least one of these components is a processor. Other components may include amplifiers, batteries, external power/battery charge, controllers, transformers, radios, buses, bridges or other electronic components. This computing device may also include a heat sink thermally coupled to the electronic components, as well as a temperature sensor that determines the current temperature inside the computing device. The temperature sensor may detect the internal temperature inside the computing device, and may also detect the temperature of the heat sink. The processor of the computing device may generate a load schedule for the electronic components based on the current temperature of the computing device. This load schedule ensures that a maximum temperature for the heat sink (or the internal air) is not exceeded. The controller of the device may then load the electronic components according to the generated load schedule.

Whereas most actively cooled devices wait until a threshold temperature has been reached and switch on a fan or pump, and whereas most passively cooled devices typically implement a large heat sink that can allow operation under the heaviest of loads, the computing device described herein implements a loading schedule to actively control which components are running and the speed or power level at which they are running. The computing device takes internal temperature readings and further determines current and future anticipated load on the device's components. Then, based on those temperature readings and load determinations, generates a load schedule that will allow for periods of high power demand, while keeping the temperature of the components in a safe range. The heat sink has an inherent inertia value that governs how quickly it heats up under load or cools down in the absence of a load. This inertia value may be used to hide small peaks of activity, while keeping the overall mass of the heat sink lower than would normally be used. User experience would not suffer, as the device can provide burst processing when needed, while at the same time avoiding overheating by reducing central processing unit (CPU) speed, reducing battery charge rate, reducing amplifier operation level, or reducing load on other components.

The following will provide, with reference to FIGS. 1A-8, detailed descriptions of computing devices, methods and computer program products that control electronic component load within a computing device to properly regulate internal device temperature. This not only ensures long life of the device's components, but also provides a reduced cost by using a smaller heat sink.

As illustrated in FIG. 1A, a computing device 100 is provided. The computing device may be any type of computing device including a desktop, laptop, handheld device (e.g. smartphone), wearable device, server or other computing system. In some embodiments, the computing device 100 may be a communications device that allows multiple people to interact with each other virtually over a computer network. For instance, the computing device 100 (or simply "device 100" herein) may include (or be connected to) a microphone, camera, and wired or wireless network adapters, which allow the device 100 to capture audio and video inputs, and communicate those inputs to other, perhaps remote users.

The computing device 100 of FIG. 1A may include a heat sink 101. As noted above, in the embodiments herein, the heat sink may be an actively cooled heat sink, or a passively cooled heat sink. While the remainder of the embodiments will be described with reference to a passively cooled heat sink, it will be recognized that an actively cooled heat sink could be interchanged as needed. The heat sink 101 of device 100 is a passively cooled heat sink. The heat sink 101 may include fins or other features that increase its surface area. The surface area of the heat sink interacts with the surrounding liquid (e.g. air, coolant, oil, etc.), transferring heat from the heat sink to the liquid via conduction, convection and/or radiation. Although only one heat sink 101 is shown in FIG. 1A, it will be recognized that substantially any number of heat sinks may be used in the device 100.

Figure 1B:
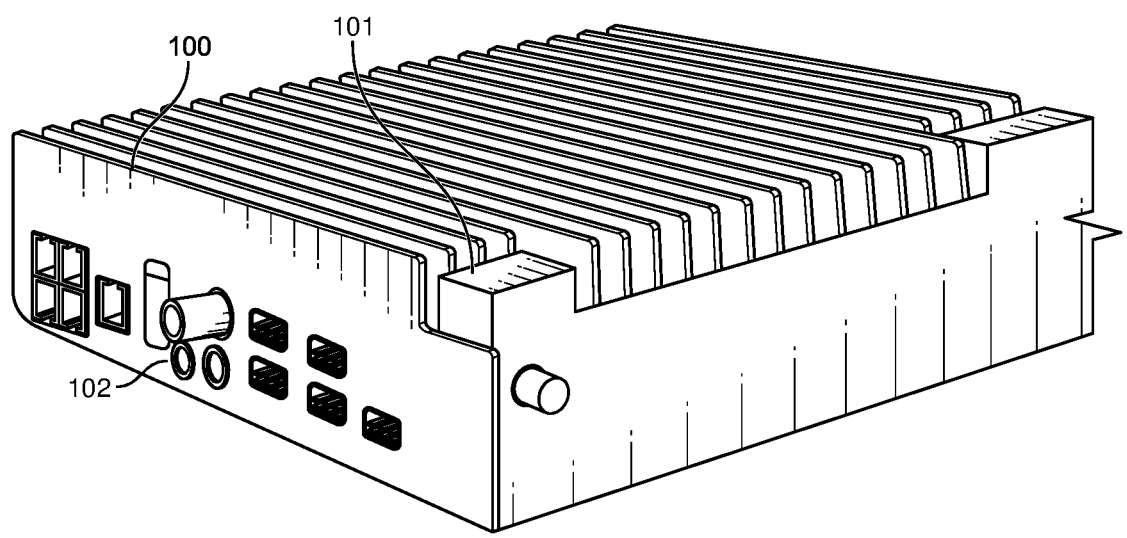
FIG. 1B illustrates an alternative view of the computing device having a passive heat sink.
Figure 2:
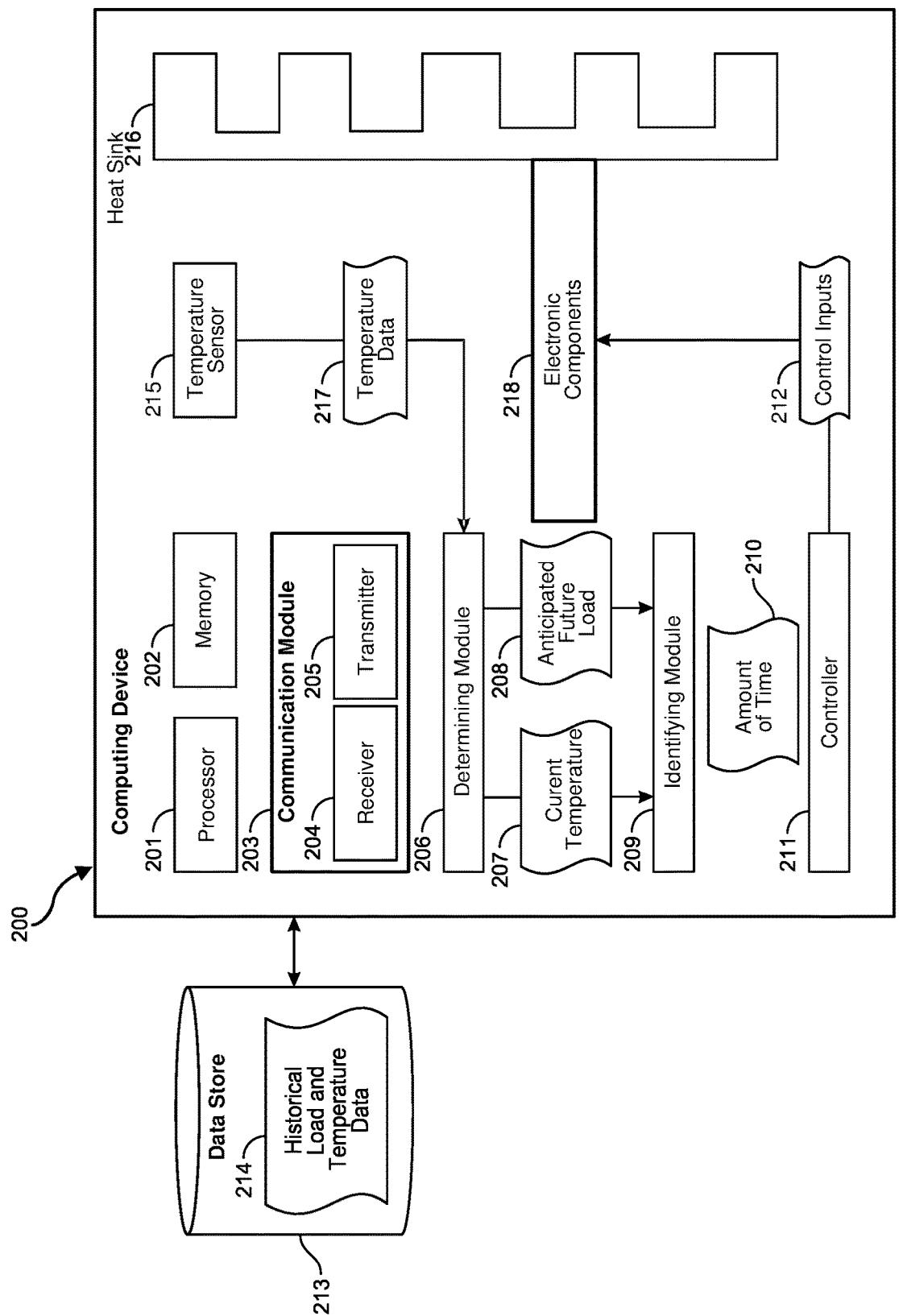
FIG. 2 illustrates an example component view of a computing device that controls electronic component load to govern internal temperature.
Figure 6:
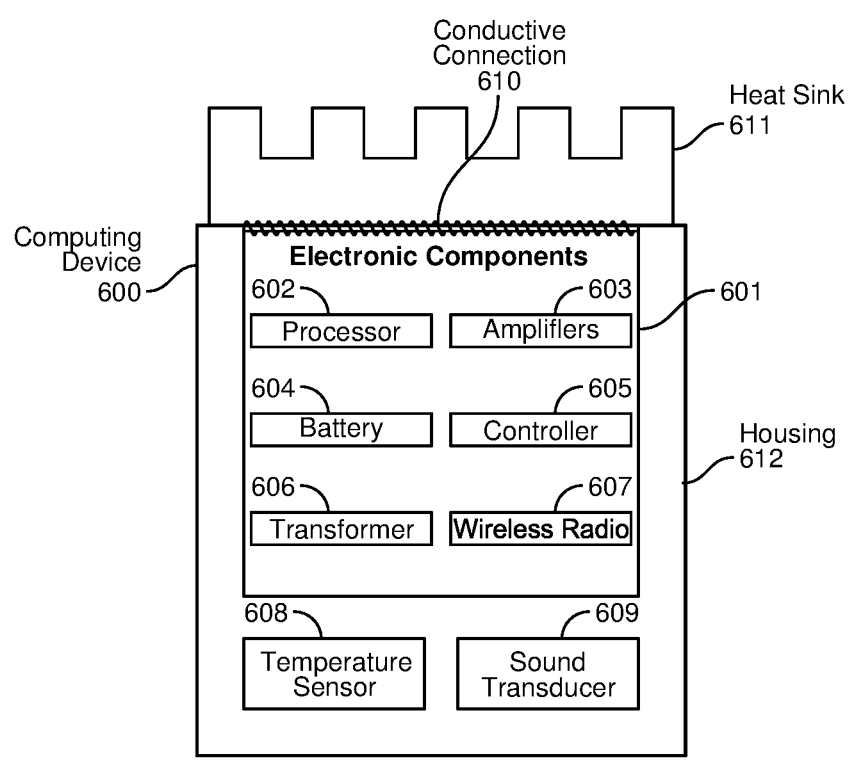
FIG. 6 illustrates an alternative component view of a computing device that controls electronic component load to govern internal temperature.

The heat sink 101 is conductively attached to one or more electronic components (represented by ports and connectors 102, and further illustrated in FIGS. 2 and 6). In some cases, one heat sink will be connected to multiple electronic components, and in other cases, multiple heat sinks may be connected to multiple electronic components. The thermally conductive connection between the heat sink and the electronic components allows heat to transfer from the electronic components to the heat sink. As the components heat up during operation, heat is continuously transferred to the heat sink, and through the heat sink to the surrounding air. As illustrated in FIGS. 1A and 1B, the heat sink 101 covers an entire surface of the computing device 100. This, however, may be altered in other embodiments where the heat sink covers only a portion of the computing device.

The computing device 100 may be mounted to a wall, table, desk or other surface using mounting hardware 103. The mounting hardware 103 allows the computing device 100 to be placed on a wall near a display such as a television or computer monitor. FIG. 1A illustrates the device 100 in a vertical mounting position, while FIG. 1B illustrates the device 100 in a horizontal mounting position. In some embodiments, the surface of the heat sink 101 may be treated (e.g. anodized) to better dissipate heat to the surroundings.

FIG. 2 illustrates a block diagram of a computing device 200 that may be similar to or the same as the computing device 100 of FIGS. 1A and 1B. Computing device 200 may include a processor 201, memory 202, and a communications module 203 with a hardware receiver 204 and a hardware transmitter 205. The communications module 104 may be configured to communicate with other computer systems. The communications module 104 may include any wired or wireless communication means that can receive and/or transmit data to or from other computer systems, including receiver 204 and transmitter 205. The communications module 203 may be configured to interact with databases, mobile computing devices (such as mobile phones or tablets), embedded computing systems or other types of computing systems.

The computing device 200 may include modules and components for performing a variety of different functions. The modules may be hardware-based, software-based, or may include a combination of hardware and software. Each module may use hardware and/or software to perform functions including those defined herein. For example, the determining module 206 may be configured to determine the current temperature 207 inside the computing device 200. The determining module may also be configured to determine an anticipated future load on the electronic components 218 of the computing device 200.

The determining module 206 may determine the current temperature inside the computing device 200 by accessing or receiving temperature data 217 from temperature sensor 215. While only a single temperature sensor is shown in FIG. 2, it will be recognized that substantially any number of temperature sensors (or other types of sensors) may be used. The temperature sensor 215 may be placed at a position within the interior of the device 200, or may be placed near or on the heat sink 216. In some embodiments, one temperature sensor will be placed on or substantially next to the heat sink 216, and another temperature sensor 215 will be placed away from the heat sink, but still within the interior of the computing device 200. The temperature sensors provide temperature data 217 in a continuous or periodic fashion to the determining module 206. The determining module then interprets the temperature data 217 and provides a current temperature indication 207 to the identifying module 209.

When determining anticipated future load 208, the determining module 206 may access current load data, potentially provided by individual components such as the processor 201 and/or memory 202, as well as historical load and temperature data 214. This historical data 214 may be stored in data store 213. The data store 213 may be local to the computing device 200, or may be remote and accessed via a wired or wireless network. The historical load data 214 may indicate that processing peaks at certain times of the day, or on certain days of the week. This may be accounted for when determining an appropriate load schedule. When load is high, the components generate a larger amount of heat. Ambient air temperature may also increase later in the day. As such, the load schedule for those times takes these observations into consideration.

The identifying module 209 uses the current temperature determination 207, current load and the anticipated future load determination 208 to identify an amount of time 210 needed for the heat sink (and/or internal air) to reach a maximum temperature. This maximum temperature may be a recommended maximum, beyond which damage may occur to the electronic components. Because heat sinks have an inertial effect, where a certain amount of time passes while the heat sink heats up and cools down in response to load, the computing device 200 may allow the system to exceed the sustainable maximum power for a specified amount of time (likely a relatively short amount of time). Thus, if a large amount of processing is needed, and that large amount of processing will cause the power to temporarily exceed the recommended sustainable maximum, the computing device 200 may allow this if the amount of processing is anticipated to decrease shortly thereafter. The computing device 200 may determine the mass of the heat sink 216 and use this knowledge of mass in its determinations. In cases where multiple heat sinks are used, the mass for each heat sink may be determined and used to allow for surge processing while keeping device temperature down. In this manner, the inertial effect of heating and cooling the heat sink (and/or the internal air temperature of the device) can allow for shorter, more intense periods of operation.

Still further, if a large amount of processing is to be sustained, the controller 211 can reduce the operation of other electronic components 218 to reduce the overall system heat generation. Thus, the controller 211 sends control signals or "control inputs" 212 to the electronic components 218 to regulate their operation on a continuous or continual basis. As heat increases inside the device 200, component operation is reduced, and as heat decreases within the device 200, component operation may be increased.

Figure 3A:
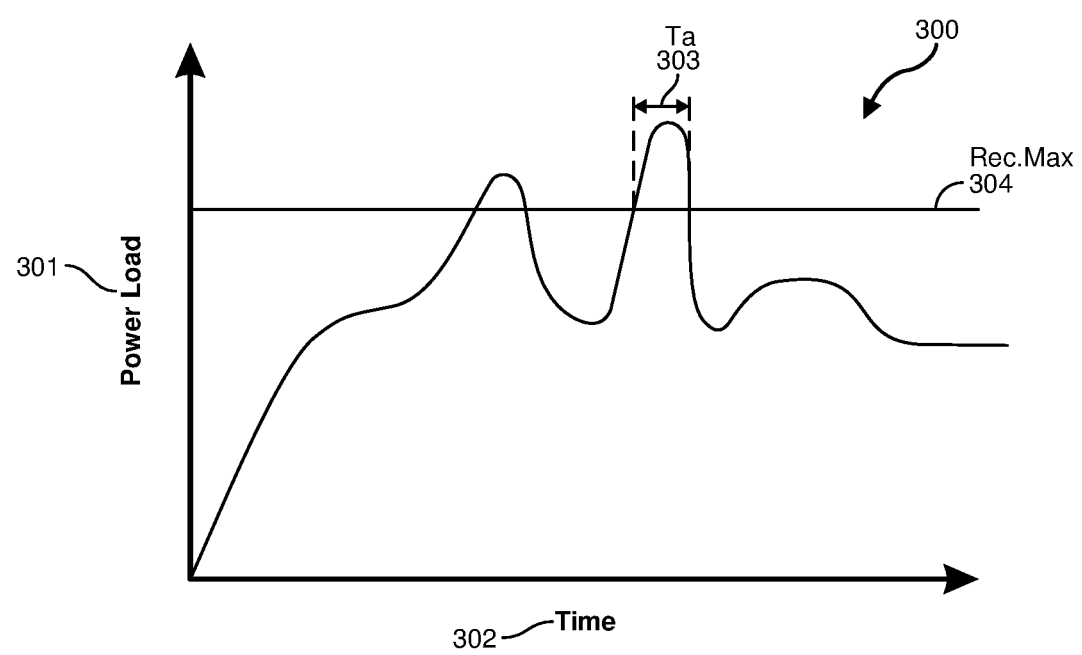
FIG. 3A illustrates a time and power load graph for the computing device.
Figure 3B:
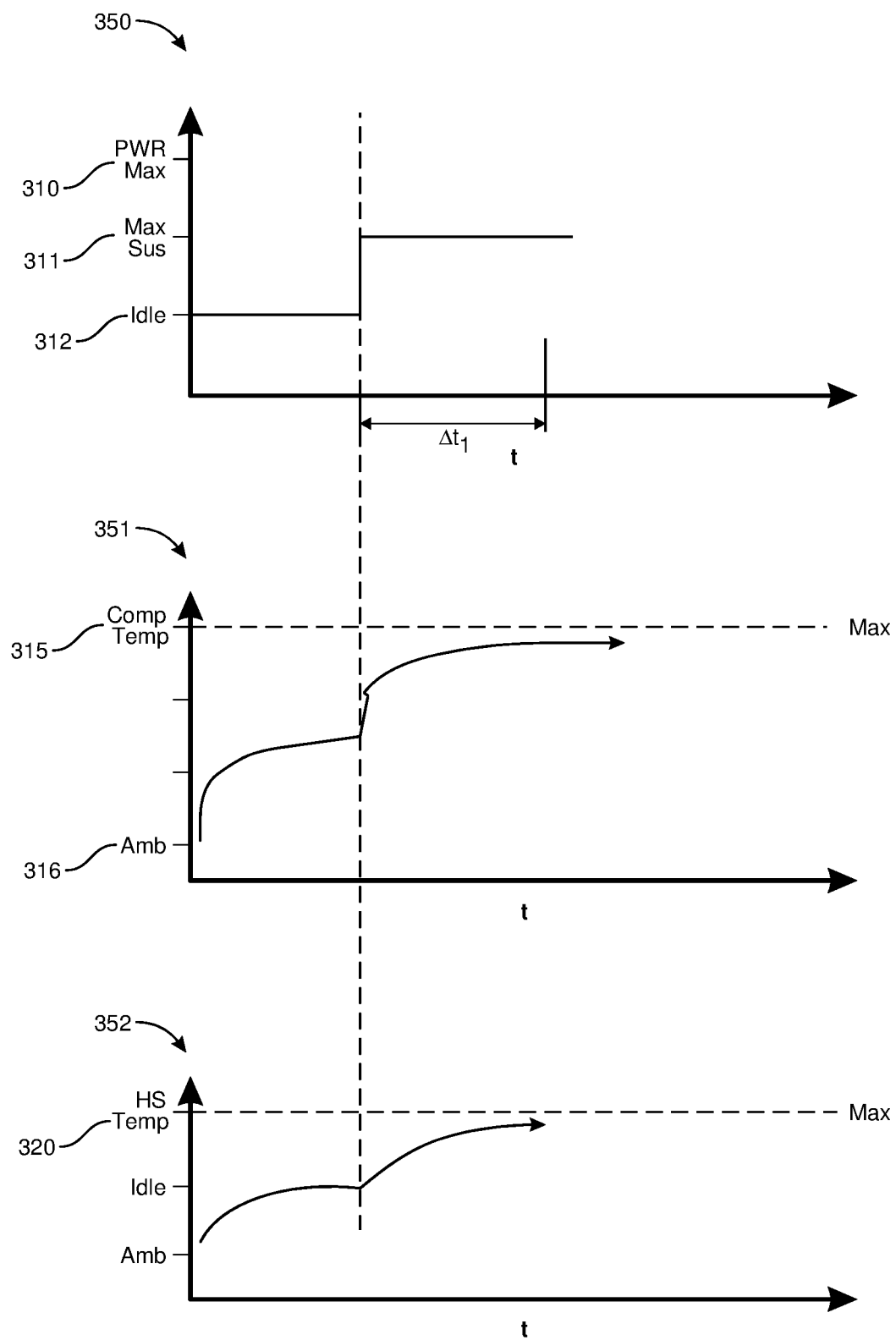
FIG. 3B illustrates an alternative time and power load graph for the computing device.
Figure 3C:
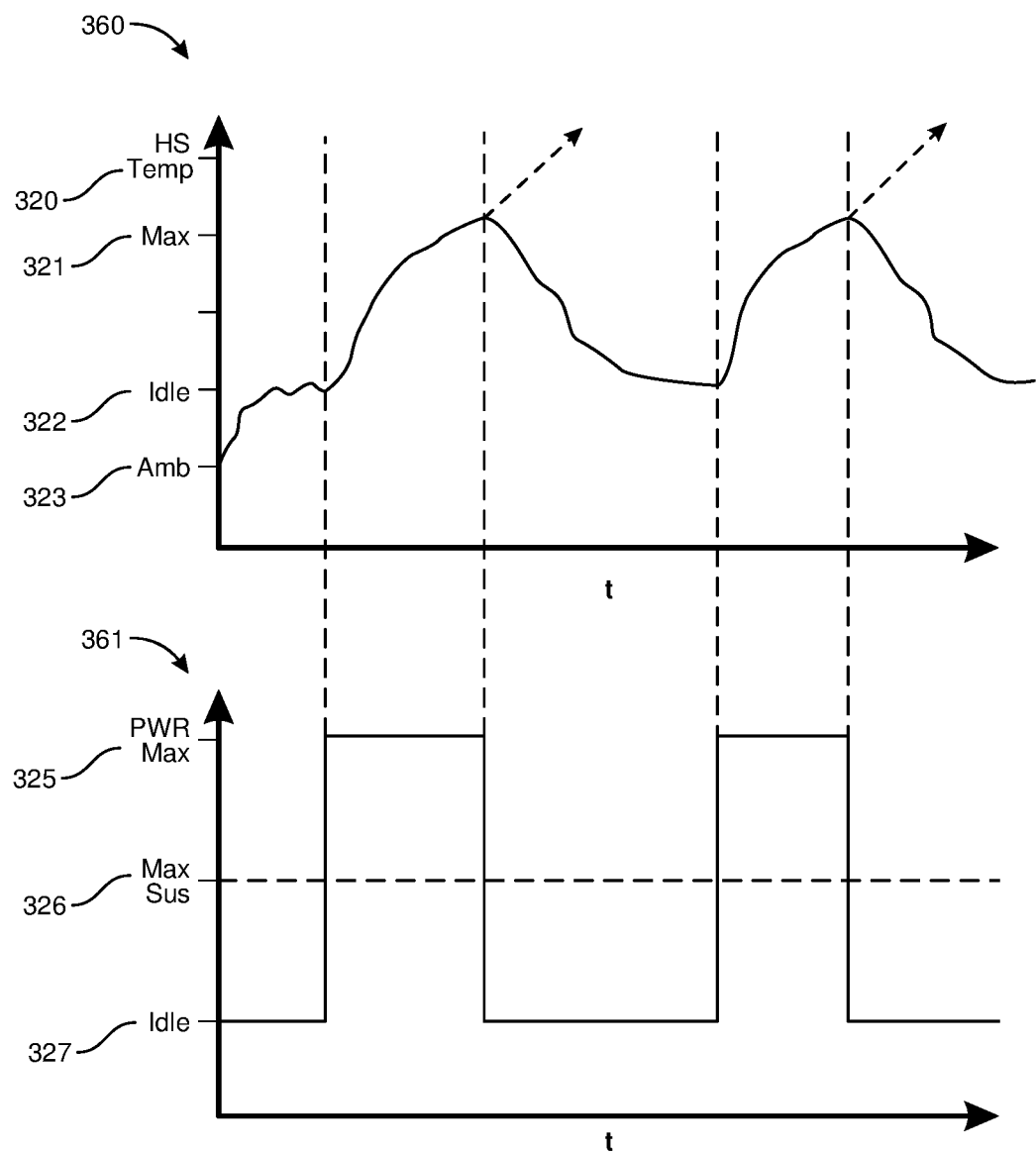
FIG. 3C illustrates an alternative time and power load graph for the computing device.
Figure 4:
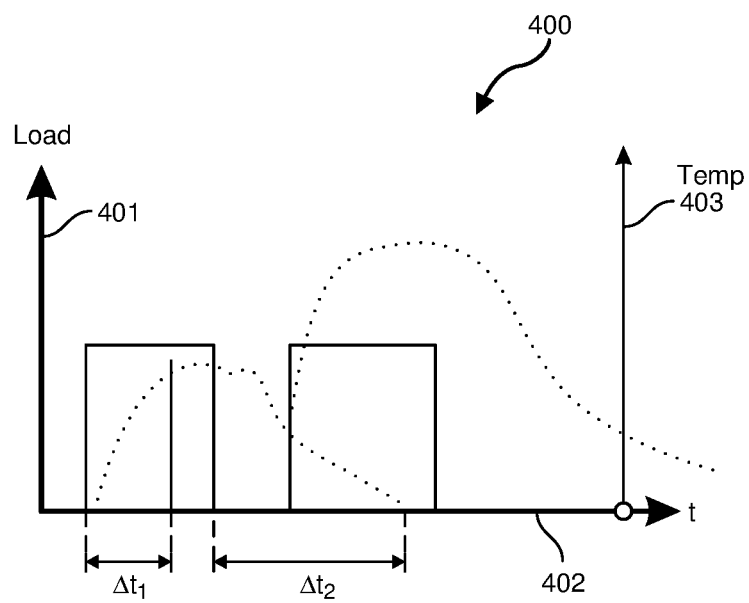
FIG. 4 illustrates an alternative time, power load and temperature graph for the computing device.
Figure 5:
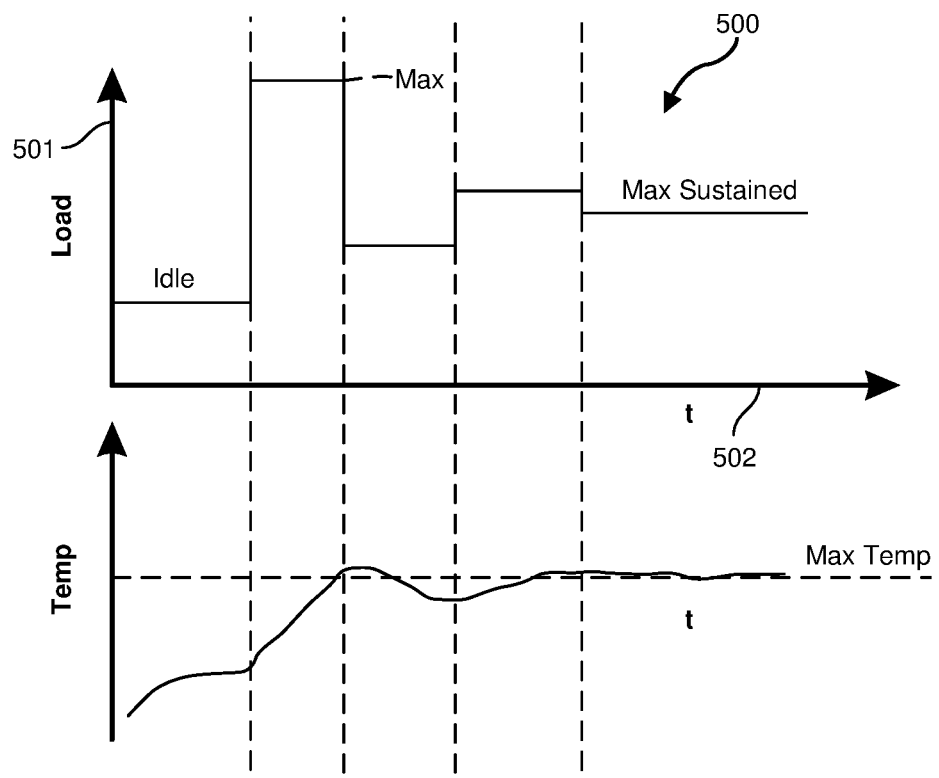
FIG. 5 illustrates an alternative time, power load and temperature graph for the computing device.

FIGS. 3-5 illustrate time, load and temperature graphs for a computing device (e.g. 100 of FIG. 1A or 200 of FIG. 2). FIG. 3A, for example, illustrates a graph 300 in which power load 301 is shown on the y-axis, and time 302 is shown on the x-axis. The time, in this case, starts at zero when the computing device is initially turned on. At time zero, the power load of the device is shown as zero, but is acknowledged to be the system idle power. Once the device is turned on, the power load begins to increase, as shown by the power load increase in the graph 300. At two points in the graph, the power load exceeds the system sustainable maximum 304. The time the sustainable maximum is exceeded is labeled as "Ta" 303, or "time above" the recommended max power load. This Ta measurement indicates that, for Ta amount of time, the device had a higher power load than the recommended maximum. Under certain design specifications, this may be permissible, as long as Ta is not longer than a specified time. This specified amount of time may be designated by the device's manufacturer, or by the device's owner or user. In some embodiments, the Ta amount 303 may be hard-coded into the device by the manufacturer. In other embodiments, the Ta amount may be selected or set by a user in device settings.

The processor of the device may use this information when generating a load schedule. Having a power load above a recommended maximum may result in a commensurate increase in internal heat. Based on current internal temperature, and based on anticipated load, the processor and controller may work together to control the amount of load on the device's various electronic components. The load may be controlled such that the amount of time, Ta, during which the recommended maximum power 304 is exceeded, is not longer than the specified time. This ensures that the electronic components do not become too hot, and that the heat sink does not overheat, potentially damaging its ability to function as intended.

FIG. 3B illustrates three linked graphs (350-352) in which system power goes from idle to the maximum amount of power that can be sustained without causing the internal air temperature (or heatsink) to rise too far. In graph 350, idle 312 represents the amount of power used to keep the system at an idle state, "Max Sus" or maximum sustainable amount 311 indicates the amount of power that can be sustained over time, and "PWR Max" 310 indicates the maximum amount of power that can be used by the system. Graph 351 indicates that a specific component's internal temperature 315 rises over time (in some cases quickly at first) from an ambient temperature 316 toward the maximum temperature, and then rises more slowly due to heat sink thermal inertia. Graph 352 shows that the heat sink temperature ("HS Temp" 320) may also rise if the component(s) are thermally coupled to the heat sink. In the embodiments herein, the device controller may be configured to keep each of the components below its maximum temperature, and also keep the internal temperature below a specified maximum for the components that have no thermal coupling to a heat sink.

FIG. 3C illustrates two linked graphs (360 and 361) in which power load can exceed the maximum sustainable load for a short period of time before the heat sink or components or internal air gets too hot. Thus, in graph 360, as the heat sink temperature ("HS Temp" 320) rises from ambient 323 to idle 322 as the power load increases, and again rises to a maximum temperature 321, the dotted line indicates how the temperature would keep increasing if the load were not reduced. As shown in the graph 360, however, upon reaching maximum temperature 321, the component power load is reduced and, correspondingly, the device temperature falls with it. In graph 361, the average maximum sustainable power 326 is briefly surpassed at two different points. At these points, the power level rises from idle 327 and goes up to maximum power 325. Although this maximum power level cannot be sustained indefinitely (as it is above the maximum sustainable line 326), it can be held for some time that will not raise the heat sink or component or internal air temperature beyond the maximum level.

FIG. 4 illustrates another time, load and temperature graph 400 for a computing device. In graph 400, the load 401 and temperature 403 are shown on the y-axis, with the load shown in solid line and the temperature shown in dotted line, and time 402 is shown on the x-axis. Two different periods of load are shown, with a corresponding rise and fall in temperature. The change in time (delta t1) shows the increase in temperature as the device begins operation. The change in time (delta t2) shows the decrease in temperature after the first load has been processed. As shown in the dotted-line temperature graph, the temperature does not fall back down to ambient temperature before the second load period hits. This causes the internal device temperature to rise to a higher level before falling back down toward ambient temperature.

FIG. 5 illustrates another time, load and temperature graph for a computing device. In graph 500, load 501 and temperature are shown on the y-axis, and time 503 is shown on the x-axis. Following the time line 503, a maximum load is placed on the electronic components of the computing device (e.g. 100 of FIG. 1A or 200 of FIG. 2). The load is illustrated in graph 550, while the temperature is shown in graph 551. The temperature of the device rises quickly due to the maximum load, toward a point that is above the maximum recommended temperature. While this maximum temperature may be exceeded in some embodiments, as described above, it may be beneficial in some embodiments to avoid exceeding this maximum recommended temperature altogether. Thus, after being at maximum, the load is reduced to a point where the temperature levels off and does not exceed the recommended maximum.

Thus, in different embodiments, the controller may modulate operation of the electronic equipment such that the maximum recommended temperature is never (or only very rarely) exceeded. Or, in other embodiments, the controller may control operation of the electronic equipment to allow brief periods of excessive temperature to provide for an optimal user experience. Settings for temperature management may be configurable by an administrator or end user, or may be hard-coded by the device's manufacturer. In cases where the settings are user-configurable, the user may be able to control the device's settings using a mobile device application or remote terminal login to manage the device remotely.

FIG. 6 illustrates an embodiment of a computing device 600 that may include multiple electronic components. These electronic components 601 may include, but are not limited to, a processor 602, one or more amplifiers 603, a battery 604, a controller 605, a transformer 606, a wireless radio 607, or other components such as temperature sensors 608, sound transducers 609 or other electronic components. Each of these components, and potentially others, may be thermally coupled to a heat sink 611. This conductive connection 610 between the electronic components may be enhanced using thermal paste or other means of more effectively transferring heat. In some embodiments, each component may be connected to its own separate heat sink, or a single heat sink may be connected to multiple components. Some electronic components generate more heat than others and, as such, heat sinks may be attached to those components that generate the most heat. The heat sink 611 may be actively cooled or passively cooled. As shown in FIG. 6, the heat sink 611 is a passive heat sink that is placed on the outside of the computing device's housing 612. In other embodiments, the heat sink(s) may be internal to the housing, or the device may include both internal and external heat sinks.

The controller 605 of the computing device 600 may be any type of hard-coded or reprogrammable microcontroller including a field programmable gate array (FPGA), electronically erasable programmable read-only memory (EEPROM), or similar device. The controller 605 may receive temperature readings from the one or more temperature sensors 608 within the computing device 600 and issue control inputs (e.g. 212 of FIG. 2) to the various electronic components. These control inputs 212 dictate how the various components operate. For example, if the controller issues a control input to the processor 602 indicating that it is to operate at a reduced rate (e.g. slow its clock speed), the processor will operate accordingly. If the controller instructs the battery 604 to charge at a slower rate, or if it instructs the amplifiers 603 to operate at a lower power level, the battery and amplifiers will operate accordingly. If the wireless radio 607 or transformer 606 are to consume less energy, the controller can control their operation so that less energy is used. This reduction in energy consumption reduces heat, which reduces load on the heat sink, giving the heat sink a chance to cool down over time.

The controller, at least in some embodiments, 605 may operate independently of the processor, reacting to sensor inputs and generating corresponding control signals. In other cases, the controller may receive inputs from the processor 602 indicating how the controller is to control the various electronic components. The processor 602 may, for example, generate a load schedule 613 for the components 601 based on the current temperature inside the computing device 600. Such a load schedule would ensure that a maximum temperature for the heat sink is not exceeded for more than a specified amount of time (or potentially never). Upon receiving this load schedule, the controller may then load the electronic components accordingly. The load schedule 613 may be updated on a periodic or push basis, so that the controller will have a continually updated load schedule that reflects the current device temperature and anticipated future workload.

When the processor 602 or controller 605 are determining the current temperature inside the computing device, they may do so in a variety of ways. They may determine the internal temperature within the device itself (i.e. within the housing 612). They may determine the current temperature of the electronic components, or a subset of the electronic components (e.g. those that are likely to get the hottest, such as the processor, amplifiers and battery). They may determine the temperature of the heat sink(s), and may also determine the temperature of the air (or other liquid) outside of the device. Any or all of these internal or external temperature measurements may be used when generating the load schedule 613.

While the computing device 600 of FIG. 6 shows the heat sink 611 as being placed on top of the computing device, it will be understood that the heat sink may be place on any of the sides, on the bottom, or on interior surfaces of the device 600. In embodiments where the computing device has a housing 612 disposed around the electronic components 601, around the temperature sensor 608 and/or around the controller 605, the heat sink 611 may be placed on a surface of the housing, may be embedded in the housing, or may itself form one or more sides of the housing.

In some embodiments, the computing device 600 is optimized or designed to facilitate communication between remote parties. For example, the computing device 600 may include a sound transducer (e.g. a microphone) that allows the computing device to detect audio inputs provided by a user. Additionally or alternatively, the computing device may include an audio input jack that allows connection with an external microphone. Any received audio inputs may then be processed by the processor 602 and transmitted to another party. Similarly, the computing device 600 may include video inputs that allow connections to external cameras or other video capturing devices. In some embodiments, the computing device may even have its own video capturing device. As video and audio signals are received and processed by the processor 602, they may be output to a television, computer monitor, speakers or other playback devices. The computing device may thus be designed to capture audio and video on one end, and provide those audio and video signals to other users or networks via the wireless radio 607.

While functioning in this manner, the computing device may generate heat, as shown in the graphs of FIGS. 3-5. When the processor 602 is generating a load schedule 613, the processor may access or determine a value for the mass of the heat sink 611. The load schedule 613 may then be calculated based on the mass of the heat sink. As noted above, the heat sink may have a certain thermal inertia value related to what it's made from, its mass and surface area). The load schedule 613 may be calculated using this inertia value, which indicates how long the heat sink will take to heat up or cool down by a specified amount. This inertia value may depend on the ambient air temperature of the room, how much dust has accumulated on the heat sink 611, how quickly the air is moving within the room, etc. The inertia value may allow the load schedule 613 to purposely allow the maximum recommended power to be exceeded for a brief period of time, or in other words, may allow intense periods of processing that are known to send the system past its recommended temperature if they were sustained. This may be done with the knowledge that the heat sink will rise in response (with some lag due to inertia), and will fall again (also with lag) once the intense processing has subsided.

In some embodiments, the load schedule 613 may be calculated to maintain an average temperature inside the computing device over a specified period of time. For example, the processor 602 may look at current temperature and anticipated future load on the electronic components, and may distribute load in such a manner that the average temperature over a period of time remains at or below a specified temperature. The processor can do this by modulating the load on the various components to reduce heat when needed, and allow other components to work harder when some components are idle. The generated load schedule 613 indicates to the controller 605 how to control the physical operation of the electronic components.

Figure 7:
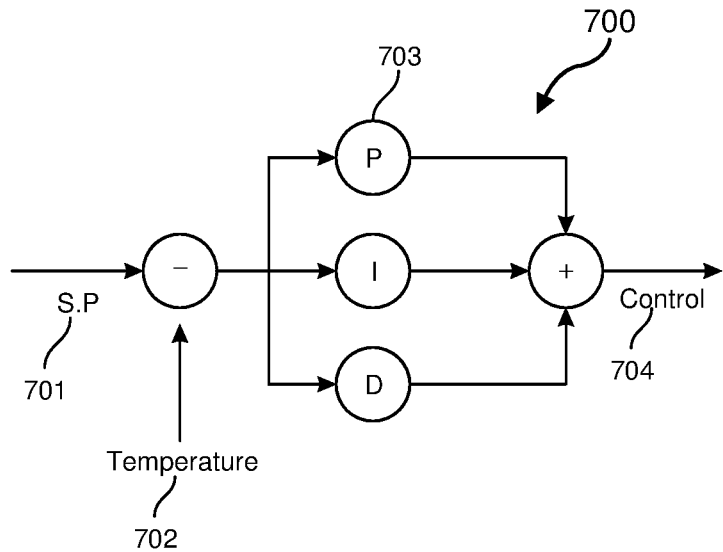
FIG. 7 illustrates an example embodiment of a controller for controlling electronic component load.

As shown in FIG. 7, a proportional-integral-derivative (PID) controller may be implemented. The PID controller 700 may receive a set point 701 as an input (indicating, for example, the maximum recommended temperature), along with the current temperature 702. The PID controller 703 may then generate control signals 704 that control the electronic components. The PID controller 700 may thus regulate the amount of energy consumed by the electronic components, which in turn controls the temperature within the computing device. In at least some embodiments, scheduled work may have a minimum power requirement and a desired power requirement. Because the scheduled work and associated power requirements are (at least partly) known before the work is processed, and because the thermal mass of the heat sink is known, these two pieces of data may be used to predict how the schedule work can be optimally processed while keeping the device's temperature below maximum. The control loop setpoint of the PID may be modified, including gain factors to better control the device. Determinations of current power, future power need, current operating mode, thermal mass and current temperatures may be used to prevent early throttling by the PID control loop if the maximum temperature will not be exceeded, and the setpoint of the PID may be adjusted to preemptively cool the device for future-planned higher-power work. This process will be explained further below with regard to method 800 of FIG. 8.

Figure 8:
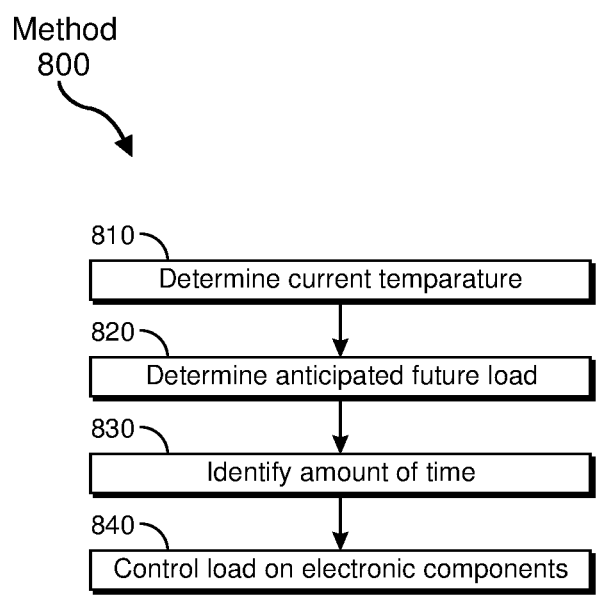
FIG. 8 illustrates a flow diagram of an exemplary method for governing internal device temperature by controlling electronic component load.

FIG. 8 is a flow diagram of an exemplary computer-implemented method 100 for extending the life of electronic equipment by controlling load placed on various electronic components according to a loading schedule. The steps shown in FIG. 8 may be performed by any suitable computer-executable code and/or computing system, including the systems illustrated in FIGS. 2 and 6. In one example, each of the steps shown in FIG. 8 may represent an algorithm whose structure includes and/or is represented by multiple sub-steps, examples of which will be described below.

As illustrated in FIG. 8, at step 810, one or more of the systems described herein may determine the current temperature of a heat sink connected to a computing device. For example, determining module 206 of computer system 200 may determine the current temperature 207 of heat sink 216. The determining module may also determine, at step 820, an anticipated future load 208 for various electronic components 218 thermally coupled to the heat sink. The identifying module 209 of computing device 200 may identify, at step 830, an amount of time 210 needed for the heat sink 216 to reach a maximum temperature based on the determined current temperature of the heat sink and based on the anticipated future load 208. At step 840, the controller 211 may control load on the electronic components 218 in such a manner that the maximum temperature of the heat sink is not exceeded for longer than a specified time.

In some embodiments, controlling load on the electronic components may include controlling central processing unit (CPU) clock speed, amplifier power level, battery charge rate, wireless radio data transfer rate or on/off status, graphics processor speed, or controlling other components in a manner that will reduce load and therefore reduce heat. In some examples, the load on the electronic components may be controlled such the average power load of the computing device 200 is at or below a specified threshold. In some cases, this threshold may be specified by a device user, while in other cases, the threshold may be specified by the device manufacturer.

This threshold may be noted by the processor when calculating the load schedule, along with a mass value for the heat sink. The processor 201 of FIG. 2 can use these values when identifying the amount of time needed for the heat sink to reach a maximum temperature. Having the mass of the heat sink, the recommended maximum temperature, the current temperature and the anticipated load, the processor may generate a highly accurate load model that indicates how much energy will be consumed by the components, how much heat will be generated, and how much heat the heat sink will be able to dissipate. When determining the load schedule, the processor may take into consideration the function of each component in the anticipated load. For example, if the processor 201 determines that the upcoming load will be very processor-intensive, or very amplifier-intensive, it can calculate a model of each component and how it will react to the upcoming load. The processor can also look at historical load data 214 to gain a deeper understanding of how the processor or amplifiers have reacted to past loads, and how much heat has been generated (and dissipated) for those past loads.

Still further, the processor 201 may be configured to recognize patterns in this data, indicating which components are best at transferring heat to the heat sink, and which are more likely to retain heat. The patterns may also indicate that the heat sink is declining in its ability to dissipate heat over time. This may indicate a lack of airflow (perhaps the computing device was placed in a corner under a desk), or may indicate a buildup of dust on the heat sink. Regardless, indications of past load distribution and heating patterns may be used to calculate a load schedule that works based on actual, current conditions of the hardware. In this sense, the computing device can adapt over time if it is moved to different locations or if hardware components begin to deteriorate, the processor can still generate a load schedule that keeps the temperature of the components in a safe range.

This is true even if an unexpected surge in processing power is needed. For example, if the computing system has never experienced an anticipated load of a given magnitude, and has no data on how the electronic components and heat sink will respond, the processor may generate a load schedule that minimizes functionality of all unnecessary components in order to allow those that are needed to function fully until the surge in processing is complete. In such examples, when the processor is identifying an optimal way to control the load, the processor may allow the load schedule to control the electronic components such that the heat sink exceeds a maximum recommended heat level for a specified amount of time. This amount of time may be brief (e.g. seconds or perhaps minutes). The inertial effect of the heat sink's mass will allow some minor ebbs and flows, even if those flows are extreme for a few moments.

In addition to or as an alternative to controlling each component separately, the processor 201 (in tandem with the controller 211) may control different subsystems within the device 200 that are each capable of being individually throttled or shut down. Each of these subsystems may have multiple different components that are controlled as a group. For example, a power subsystem may include a battery and a transformer. This subsystem may be controlled as a unit by the processor and/or controller. Thus, controlling load on the electronic components may include shutting down or throttling some of the computing device's subsystems (in addition to individual components) for a specified amount of time in order to reduce heat generated within the device.

In some examples, the above-described method may be encoded as computer-readable instructions on a computer-readable medium. For example, a computer-readable medium may include one or more computer-executable instructions that, when executed by at least one processor of a computing device, may cause the computing device to determine the current temperature of a heat sink connected to a computing device, determine an anticipated future load for various electronic components thermally coupled to the heat sink, identify an amount of time needed for the heat sink to reach a maximum temperature based on the determined current temperature of the heat sink and based on the anticipated future load, and control load on the one or more electronic components so that the maximum temperature of the heat sink is not exceeded for longer than a specified time.

Accordingly, in this manner, temperature within a device, whether the device is actively cooled or passively cooled, may be controlled by regulating power consumption of the device's components. The device may detect or otherwise be aware of its heat sink mass, and may use this mass's inertial effect to allow sporadic increases in processing resources. Such increases allow the device to provide extra processing when needed to ensure that the user has a smooth and seamless experience with the application. By controlling the level of heat within the device, the life of the device will also be prolonged.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. For example, one or more of the modules recited herein may receive data to be transformed, transform the data, output a result of the transformation to perform an intended function, use the result of the transformation to perform a function, and store the result of the transformation to perform a function. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components)

connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

We claim:

1. A communication device comprising:
a processor;
a sound transducer electrically connected to an amplifier;
a camera;
a housing; and
a heat sink thermally connected to the housing,
wherein the processor:
   determines, based on a current temperature of the heat sink, that the communication device is permitted to exceed a sustainable maximum power level for a specified time above the sustainable maximum power level in order to carry out a temporary processing surge; and
   initiates the temporary processing surge on the communication device, such that the temporary processing surge exceeds the sustainable maximum power level for a limited time above the sustainable maximum power level to avoid exceeding a maximum allowable temperature of the heat sink.

2. The communication device of claim 1, wherein the processor is further configured to determine a current temperature inside the communication device including determining the current temperature of at least one processing component including the processor.

3. The communication device of claim 2, wherein determining the current temperature inside the communication device comprises determining an internal air temperature within the housing.

4. The communication device of claim 1, wherein the housing is disposed around one or more processing components including the processor, a temperature sensor, and/or the heat sink.

5. The communication device of claim 1, wherein the sound transducer is configured to detect audio inputs, and wherein the audio inputs are processed by the processor.

6. The communication device of claim 1, wherein a value for a thermal mass of the heat sink is accessed or detected by the processor via a temperature sensor, and wherein the processor calculates a load schedule based on the thermal mass of the heat sink.

7. The communication device of claim 6, wherein the load schedule is further calculated based on an inertia value indicating how long the heat sink will take to heat up or cool down by a specified amount.

8. The communication device of claim 6, wherein the load schedule is calculated to maintain an average power load of the communication device over a specified period of time.

9. The communication device of claim 6, wherein the load schedule is calculated based on an anticipated future load on the processor.

10. The communication device of claim 6, wherein the load schedule controls physical operation of the processor, such that energy consumed by the processor is reduced or increased dynamically by a controller according to the load schedule.

11. The communication device of claim 1, wherein the heat sink comprises a passive heat sink.

12. A system comprising:
at least one processor; and
a sound transducer electrically connected to an amplifier;
a camera;
a housing;
a heat sink thermally connected to the housing; and
physical memory comprising computer-executable instructions that, when executed by the processor, cause the processor to:
   determine, based on a current temperature of the heat sink, that the system is permitted to exceed a sustainable maximum power level for a specified time above the sustainable maximum power level in order to carry out a temporary processing surge; and
   initiate the temporary processing surge on the system, such that the temporary processing surge exceeds the sustainable maximum power level for a limited time above the sustainable maximum power level to avoid exceeding a maximum allowable temperature of the heat sink.

13. The system of claim 12, wherein initiating the temporary processing surge on the at least one processor includes controlling central processing unit (CPU) clock speed, amplifier power level, or battery charge rate.

14. The system of claim 12, wherein load on the at least one processor during the temporary processing surge is controlled such that an average power load of the processor is at or below a specified threshold.

15. The system of claim 12, wherein the at least one processor further identifies an amount of time needed for the heat sink to reach a maximum temperature based on at least one of the determined current temperature of the heat sink or an anticipated future load on the at least one processor.

16. The system of claim 15, wherein identifying the amount of time needed for the heat sink to reach the maximum temperature includes accessing or determining a thermal mass value indicating the thermal mass of the heat sink, and using the thermal mass of the heat sink when identifying the needed amount of time.

17. The system of claim 12, wherein the temporary processing surge includes controlling load on the at least one processor by accessing and implementing one or more portions of historical load or temperature data for the system.

18. The system of claim 12, further comprising one or more subsystems that are each capable of being individually controlled or shut down.

19. The system of claim 18, wherein the temporary processing surge includes increasing power to one or more of the subsystems for at least a specified amount of time.

20. A non-transitory computer-readable medium comprising one or more computer-executable instructions that, when executed by at least one processor of a communication device, cause the communication device to:
   determine, based on a current temperature of a heat sink, that the communication device is permitted to exceed a sustainable maximum power level for a specified time above the sustainable maximum power level in order to carry out a temporary processing surge; and
   initiate the temporary processing surge on the communication device, such that the temporary processing surge exceeds the sustainable maximum power level for a limited time above the sustainable maximum power level to avoid exceeding a maximum allowable temperature of the heat sink.

* * * * *